United States Patent
Kwon et al.

(10) Patent No.: US 8,847,484 B2
(45) Date of Patent: Sep. 30, 2014

(54) MOTHER SUBSTRATE FOR FLAT PANEL DISPLAY APPARATUS AND METHOD OF MANUFACTURING THE SAME

(75) Inventors: Oh-Seob Kwon, Yongin (KR); Sung-Soo Koh, Yongin (KR); Byung-Uk Han, Yongin (KR); Jung-Jun Im, Yongin (KR); Jae-Sang Ro, Seoul (KR); Seog-Young Lee, Seoul (KR); Won-Eui Hong, Seoul (KR)

(73) Assignees: Samsung Display Co., Ltd., Yongin, Gyeonggi-Do (KR); Ensil Tech Co., Ltd., Seoul (KR)

( * ) Notice: Subject to any disclaimer, the term of this patent is extended or adjusted under 35 U.S.C. 154(b) by 552 days.

(21) Appl. No.: 13/064,809

(22) Filed: Apr. 18, 2011

(65) Prior Publication Data

US 2011/0291118 A1    Dec. 1, 2011

(30) Foreign Application Priority Data

Jun. 1, 2010    (KR) .................. 10-2010-0051967

(51) Int. Cl.
*H01L 51/50*    (2006.01)
*H01L 51/52*    (2006.01)
*H01L 27/32*    (2006.01)

(52) U.S. Cl.
CPC ....... *H01L 27/3276* (2013.01); *H01L 2251/566* (2013.01); *H01L 51/5246* (2013.01)
USPC ............. 313/512; 313/498; 313/505; 445/25; 257/40; 257/100; 257/E33.059

(58) Field of Classification Search
CPC ................. H01L 27/3276; H01L 51/5246
USPC ............ 313/498–512; 257/40, 88, 100, 257/E33.059; 445/25
See application file for complete search history.

(56) References Cited

U.S. PATENT DOCUMENTS

| | | | |
|---|---|---|---|
| 5,805,117 A * | 9/1998 | Mazurek et al. | 345/1.3 |
| 2007/0096631 A1 * | 5/2007 | Sung et al. | 313/498 |
| 2009/0045732 A1 | 2/2009 | Kwak et al. | |
| 2009/0218320 A1 | 9/2009 | Wang | |
| 2009/0218932 A1 | 9/2009 | Wang | |

FOREIGN PATENT DOCUMENTS

| | | |
|---|---|---|
| JP | 2000-252058 | 9/2000 |
| KR | 10-2001-0109011 A | 12/2001 |

(Continued)

OTHER PUBLICATIONS

Korean Notice of Allowance in KR 10-2010-0051967, dated Mar. 27, 2012 (Kwon, et al.).

*Primary Examiner* — Jose R Diaz
(74) *Attorney, Agent, or Firm* — Lee & Morse, P.C.

(57) ABSTRACT

A mother substrate for forming flat panel display apparatuses and a method of manufacturing the same, the mother substrate including a substrate; a plurality of display units on the substrate, the display units being for forming a plurality of flat panel display apparatuses; a sealing substrate facing the display units; sealing members between the substrate and the sealing substrate, the sealing members surrounding each of the display units; a plurality of wiring units between the substrate and the sealing substrate, the wiring units overlapping the sealing members; a connecting unit including a conductive material, the connecting unit connecting adjacent wiring units in one direction and having a width that is greater than a width of each of the wiring units; and inlets connected to the plurality of wiring units and an external power source, the inlets being for applying a voltage to the plurality of wiring units.

22 Claims, 14 Drawing Sheets

(56) References Cited

FOREIGN PATENT DOCUMENTS

| KR | 10-2001-0111846 A | 12/2001 |
| KR | 10-2003-0080895 A | 10/2003 |
| KR | 10-2006-0028212 A | 3/2006 |
| KR | 10-2006-0079615 A | 7/2006 |
| KR | 10 2007-0038312 A | 4/2007 |
| KR | 10-0761162 B1 | 9/2007 |
| KR | 10-0840090 B1 | 6/2008 |

* cited by examiner

MOTHER SUBSTRATE FOR FLAT PANEL DISPLAY APPARATUS AND METHOD OF MANUFACTURING THE SAME

BACKGROUND

1. Field

Embodiments relate to a mother substrate for a flat panel display apparatus and a method of manufacturing the same.

2. Description of the Related Art

Recently, display devices have been replaced by flat panel display apparatuses that are portable. In particular, flat panel display apparatuses, e.g., organic light emitting display apparatuses and liquid crystal display apparatuses, are highlighted due to their excellent image quality.

In a flat panel display apparatus, a display unit may be disposed on a substrate and a sealing substrate may be disposed on the display unit to protect the display unit. In addition, a sealing member may be disposed between the substrate and the sealing substrate.

For convenience of manufacturing the flat panel display apparatus, a mother substrate on which display units and the sealing member are formed may be disposed between the substrate and the sealing substrate. Then, the assembly may be cut into the display units so that each of the display units forms a flat panel display apparatus.

In addition, a sealing process of the flat panel display apparatus may be performed to protect the display unit against, e.g., external moisture, vapor, and other impurities. Thus, the quality of the flat panel display apparatus may be largely affected by a sealing property of the flat panel display apparatus.

The sealing property may depend upon the sealing substrate and the sealing member.

SUMMARY

Embodiments are directed to a mother substrate for a flat panel display apparatus and a method of manufacturing the same, which represent advances over the related art.

It is a feature of an embodiment to provide a mother substrate for a flat panel display apparatus having improved sealing properties.

At least one of the above and other features and advantages may be realized by providing a mother substrate for forming flat panel display apparatuses, the mother substrate including a substrate; a plurality of display units on the substrate, the display units being for forming a plurality of flat panel display apparatuses; a sealing substrate facing the display units; sealing members between the substrate and the sealing substrate, the sealing members surrounding each of the display units; a plurality of wiring units between the substrate and the sealing substrate, the wiring units overlapping the sealing members; a connecting unit including a conductive material, the connecting unit connecting adjacent wiring units in one direction and having a width that is greater than a width of each of the wiring units; and inlets connected to the plurality of wiring units and an external power source, the inlets being for applying a voltage to the plurality of wiring units.

The wiring units may be on the substrate, and the sealing members may be between the wiring units and the sealing substrate.

Each of the inlets may have a width greater than a width of each of the wiring units.

The mother substrate may further include a protective layer between the wiring units and the sealing members.

The protective layer may extend on upper portions of the inlets.

The sealing members may include a frit.

Each of the display units may include an organic light-emitting device.

The mother substrate may further include conductive points, wherein the plurality of wiring units include a plurality of wiring unit groups, each of the wiring unit groups includes wiring units arranged along one direction and the connecting unit for connecting the wiring units, the plurality of wiring unit groups are arranged in another direction that crosses the one direction, and the conductive points are electrically connected to the external power source and the inlets, the inlets connecting the plurality of wiring unit groups and the conductive points to each other.

Magnitudes of voltage drops in the inlets may be about the same in a condition in which voltage is applied from the external power source.

The inlets may have the same lengths.

One of the inlets having a first length may have an average width smaller than an average width of another one of the inlets having a second length greater than the first length.

One of the inlets having a first length may have a thickness smaller than a thickness of another one of the inlets having a second length greater than the first length.

The inlets may include branching lines at respective ends of each wiring unit group; extension units connected to ends of the plurality of branching lines; and a center unit connecting the conductive points and the extension units to each other, and wherein a width of the extension unit at a region closer to the center unit is greater than a width of the extension unit at a region farther from the center unit.

The center unit may have a width greater than a width of the extension unit.

The conductive points may face opposite sides of the plurality of wiring unit groups.

At least one of the above and other features and advantages may also be realized by providing a method of manufacturing a mother substrate for forming flat panel display apparatuses, the mother substrate including a substrate; a plurality of display units on the substrate for forming a plurality of flat panel display apparatuses; a sealing substrate facing the display units; sealing members between the substrate and the sealing substrate and surrounding each of the display units; a plurality of wiring units between the substrate and the sealing substrate and overlapping the sealing members; a connecting unit including a conductive material, connecting adjacent wiring units in one direction, and having a width greater than a width of each of the wiring units; and inlets connected to the plurality of wiring units and being for applying a voltage to the plurality of wiring units, the method including forming the sealing members by melting and hardening a material for forming the sealing members, the melting including using heat generated from the wiring units by applying a voltage from an external power source to the inlets and the wiring units.

The sealing members may include a frit.

The mother substrate may further include conductive points, the plurality of wiring units may include a plurality of wiring unit groups, each of the wiring unit groups may include wiring units arranged along one direction and the connecting unit for connecting the wiring units, the plurality of wiring unit groups may be arranged in another direction that crosses the one direction, and the conductive points may be electrically connected to the external power source and the inlets, the inlets connecting the plurality of wiring unit groups and the conductive points to each other.

Magnitudes of voltage drops in the inlets may be about the same when applying voltage from the external power source.

The inlets may have the same lengths.

One of the inlets having a first length may have an average width smaller than an average width of another one of the inlets having a second length greater than the first length.

One of the inlets having a first length may have a thickness smaller than a thickness of another one of the inlets having a second length greater than the first length.

The inlets may include branching lines at respective ends of each wiring unit group; extension units connected to ends of the plurality of branching lines; and a center unit connecting the conductive points and the extension units to each other, and wherein a width of the extension unit at a region closer the center unit is greater than a width of the extension unit a region further from the center unit.

The center unit may have a width greater than a width of the extension unit.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
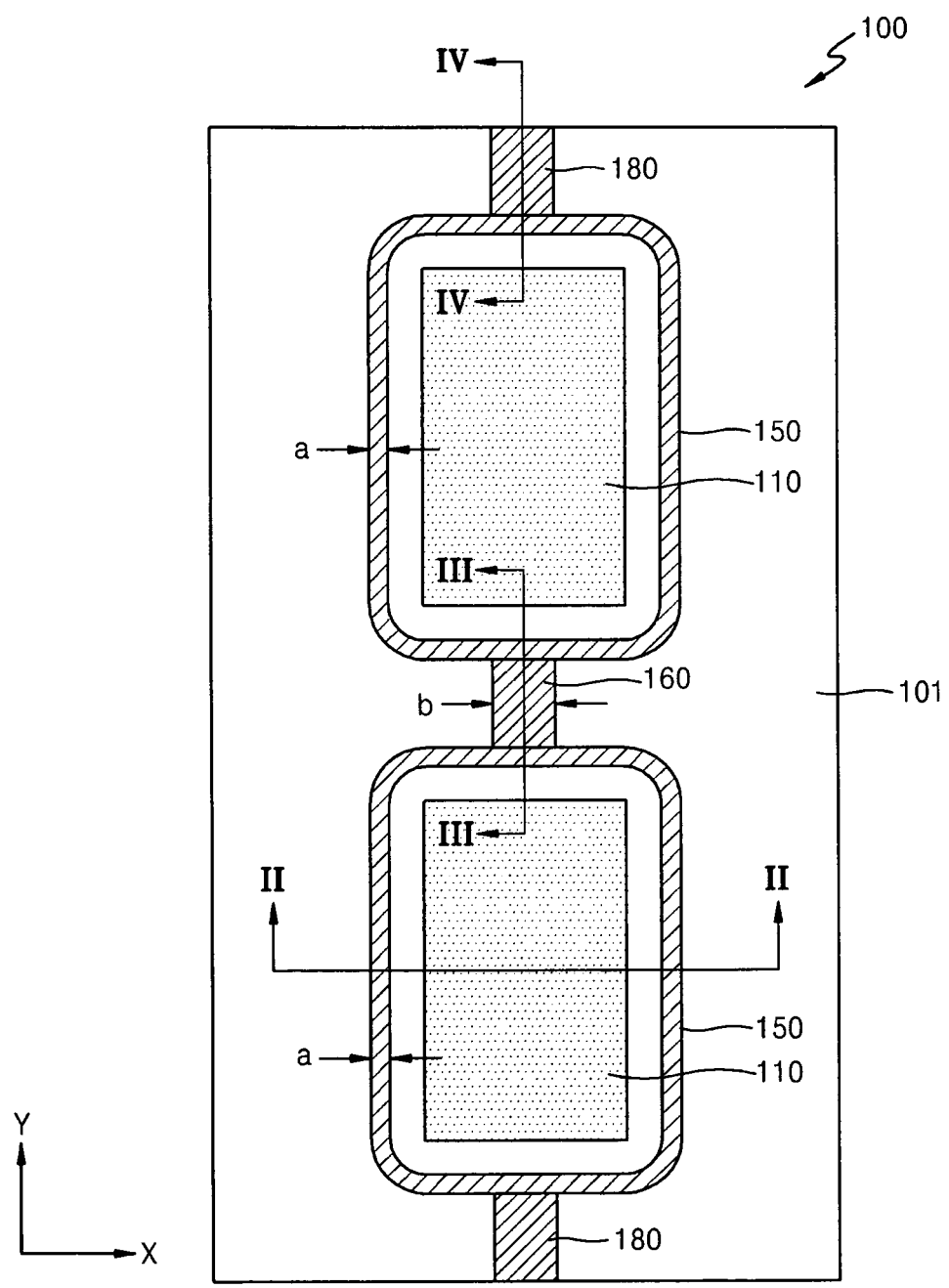
FIG. 1 illustrates a schematic plan view of a mother substrate for a flat panel display apparatus according to an embodiment.

Korean Patent Application No. 10-2010-0051967, filed on Jun. 1, 2010, in the Korean Intellectual Property Office, and entitled: "Mother Substrate for Flat Panel Display Apparatus and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
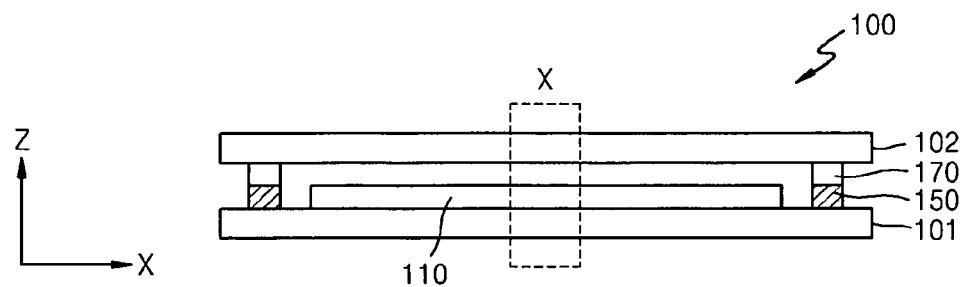
FIG. 2 illustrates a cross-sectional view of the mother substrate taken along line II-II of FIG. 1.
Figure 3:
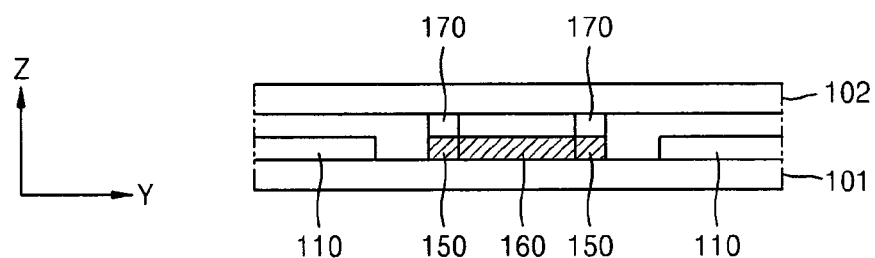
FIG. 3 illustrates a cross-sectional view of the mother substrate taken along line III-III of FIG. 1.
Figure 4:
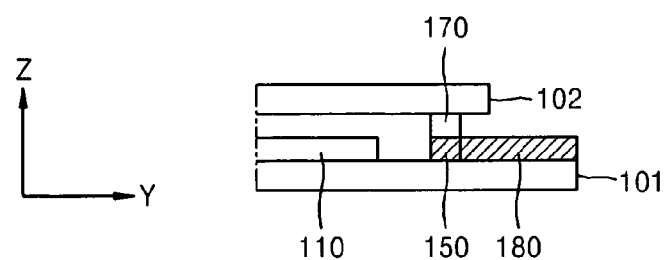
FIG. 4 illustrates a cross-sectional view of the mother substrate taken along line IV-IV of FIG. 1.
Figure 5:
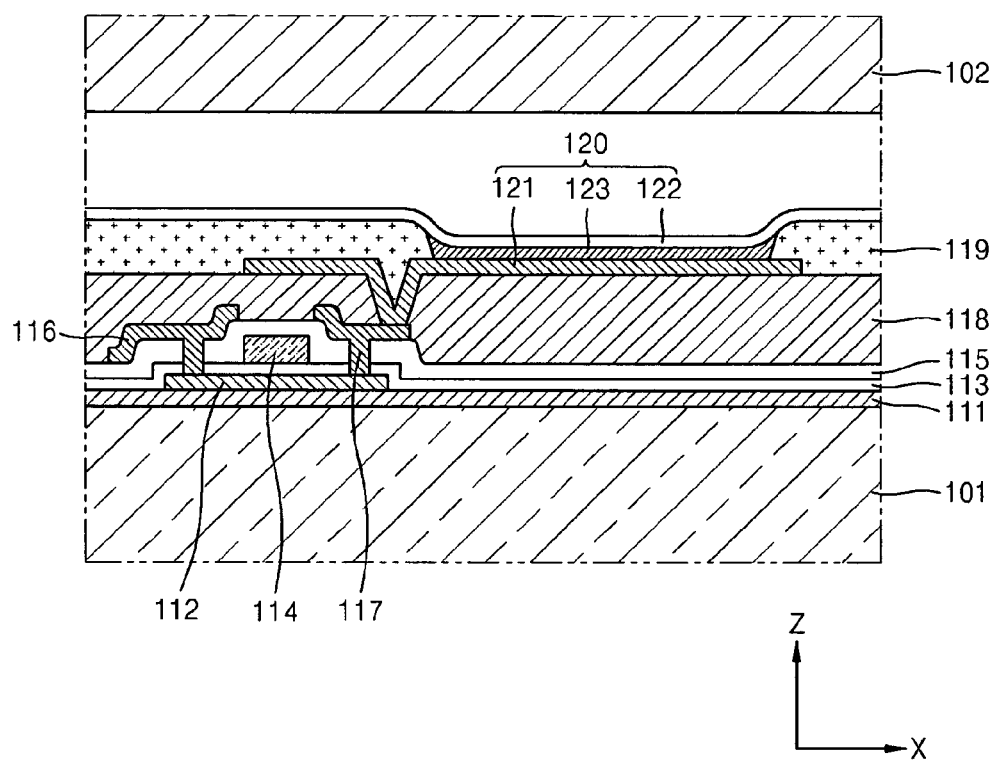
FIG. 5 illustrates an enlarged view showing a part X of FIG. 2.

FIG. 1 illustrates a schematic plan view of a mother substrate 100 for a flat panel display apparatus according to an embodiment. FIG. 2 illustrates a cross-sectional view of the mother substrate 100 taken along line II-II of FIG. 1. FIG. 3 illustrates a cross-sectional view of the mother substrate 100 taken along line III-III of FIG. 1. FIG. 4 illustrates a cross-sectional view of the mother substrate 100 taken along line IV-IV of FIG. 1. FIG. 5 illustrates an enlarged view showing a part X of FIG. 2. In FIG. 1, sealing substrates 102 are not shown for the convenience of explanation.

Referring to FIGS. 1 through 5, the mother substrate 100 for the flat panel display apparatus may include a substrate 101, display units 110, the sealing substrates 102, wiring units 150, sealing members 170, connecting units 160, and inlets 180.

In an implementation, the substrate 101 may be formed of, e.g., a glass material including silicon oxide ($SiO_2$) or a transparent plastic material. However, the material for forming the substrate 101 is not limited to the above example, and the substrate 101 may be formed of a transparent plastic material. In an implementation, the substrate 101 may include a plastic material e.g., an organic material including at least one of polyethersulfone (PES), polyacrylate (PAR), polyetherimide (PEI), polyethyelenene napthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

The display units 110 may be disposed on the substrate 101. Each of the display units 110 may respectively form a flat panel display apparatus. FIG. 1 illustrates two display units 110, and thus, two flat panel display apparatuses may be finally fabricated using the mother substrate 100 of the present embodiment.

The display unit 110 may be variously formed. In the present embodiment, the display unit 110 may include an organic light-emitting display device. However, in an implementation, the display unit 110 may include a liquid crystal display device.

The sealing substrate 102 may face the display unit 110. The sealing member 170 may be between the substrate 101 and the sealing substrate 102. The sealing member 170 may surround each of the display units 110. The sealing member 170 may facilitate coupling of the substrate 101 and the sealing substrate 102. The sealing member 170 may include, e.g., frit.

Each of the wiring units 150 may overlap the sealing member 170. For example, the wiring unit 150 may surround each of the display units 110. The wiring unit 150 may be formed on the substrate 101, the sealing member 170 may be formed on the wiring unit 150, and the sealing substrate 102 may be disposed on the sealing member 170.

The wiring unit 150 may be formed of various conductive materials.

The wiring units 150 may be arranged in one direction (Y-direction of FIG. 1), and the connecting units 160 may be disposed between the wiring units 150. Each of the connecting units 160 may connect adjacent wiring units 150 to each other. The connecting unit 160 may include a conductive material, which may be the same as the material of the wiring unit 150.

A width "b" of the connecting unit 160 may be greater than a width "a" of the wiring unit 150. In a heating process for forming the sealing member 170, a voltage may be applied to the wiring unit 150. The voltage may be applied from an external power source via the inlet 180 to the wiring unit 150. Therefore, electric current may flow through each of the wiring units 150, in particular, in the upper wiring unit 150 of the two wiring units 150 illustrated in FIG. 1. Current flowing through a left portion of the upper wiring unit 150 and current flowing through a right portion of the upper wiring unit 150 may meet at the connecting unit 160. Then, the current may flow through left and right portions of the lower wiring unit 150 of the two wiring units 150 again.

For example, a voltage required to generate heat for a melting operation when the sealing member 170 is formed may be applied to the wiring unit 150. However, since the current flowing through the left and right portions of the wiring unit 150 may flow simultaneously to the connecting unit 160, a greater load than that in the wiring unit 150 may be generated in the connecting unit 160. For example, if the width "b" of the connecting unit 160 and the width "a" of the wiring unit 150 were the same, twice the heat of the wiring unit 150 may be generated by the connecting unit 160, and thus, the connecting unit 160 may be damaged.

The connecting unit 160 of the present embodiment may have a width greater than that of the wiring unit 150 so that excessive heat may not be generated. In more detail, the width of the connecting unit 160 may be about twice the width of the wiring unit 150 or greater. Thus, the unit 160 may generate heat similar to the wiring unit 150.

The inlet 180 may connect to the wiring unit 150. The inlets 180 may be formed on end portions of the two wiring units 150 illustrated in FIG. 1. An external power source (not illustrated) may be connected to the inlet 180. Thus, the voltage may be applied to the wiring unit 150 to generate heat. Then, the sealing member 170 may be melted by the heat generated in the wiring unit 150. Finally, the sealing member 170 may harden. The inlet 180 may be formed of the same material as the wiring unit 150.

In addition, the inlet 180 may have a width that is greater than the width "a" of the wiring unit 150. In particular, the width of the inlet 180 may be about twice the width or greater than the width "a" of the wiring unit 150. Thus, the heat generated from the inlet 180 may be adjusted to be similar to the heat generated from the wiring unit 150, like the connecting unit 160.

The display unit 110 may be variously formed and, in an implementation, the display unit 110 may include an organic light-emitting device. The display unit 110 will be described below in detail with reference to FIG. 5.

A buffer layer 111 may be formed on the substrate 101. The buffer layer 111 may provide a flat surface on an upper portion of the substrate 101 and may prevent moisture and impurities from infiltrating into the substrate 101.

An active layer 112 may be formed on the buffer layer 111 in a predetermined pattern. The active layer 112 may be formed of an inorganic semiconductor, e.g., amorphous silicon or poly silicon, or an organic semiconductor, and may include a source region, a drain region, and a channel region.

The source and drain regions may be formed by doping the active layer 112 formed of the amorphous silicon or polysilicon, e.g., with impurities. When the source and drain regions are doped with a group III element, e.g., boron (B), a p-type semiconductor may be formed. When the source and drain regions are doped with a group V element, e.g., nitrogen (N), an n-type semiconductor may be formed.

A gate insulating layer 113 may be formed on the active layer 112 and a gate electrode 114 may be formed on a predetermined region on the gate insulating layer 113. The gate insulating layer 113 is may insulate the active layer 112 and the gate electrode 114 from each other and may be formed of an organic material or an inorganic material, e.g., $SiN_x$ and $SiO_2$.

The gate electrode 114 may be formed of a metal or a metal alloy, e.g., Au, Ag, Cu, Ni, Pt, Pd, Al, Mo, an alloy of Al:Nd, or an alloy of Mo:W. However, the material for forming the gate electrode 114 is not limited to the above examples, and various suitable materials may be used in consideration of adherence, flatness, electrical resistance, and processability. The gate electrode 114 may be connected to a gate line (not shown) via which electrical signals are applied.

An interlayer dielectric 115 may be formed on an upper portion of the gate electrode 114. The interlayer dielectric 115 and the gate insulating layer 113 may expose the source and drain regions of the active layer 112. A source electrode 116 and a gate electrode 117 may contact the exposed source and drain regions of the active layer 112.

The source electrode 116 and the drain electrode 117 may be formed of a material including, e.g., Au, Pd, Pt, Ni, Rh, Ru, Ir, or Os, and an alloy of two or more metals, e.g., Al, Mo, Al:Nd alloy, or MoW alloy; however, the embodiments are not limited to the above examples.

A passivation layer 118 may cover the source and drain electrodes 116 and 117. The passivation layer 118 may include an inorganic insulating layer and/or an organic insulating layer. The inorganic insulating layer may include, e.g., $SiO_2$, SiNx, SiON, $Al_2O_3$, $TiO_2$, $Ta_2O_5$, $HfO_2$, $ZrO_2$, BST, or PZT. The organic insulating layer may include, e.g., general universal polymers (PMMA or PS), polymer derivatives including a phenol group, acryl-based polymers, imide-based polymers, aryl ether-based polymers, amide-based polymer, p-xylene based polymers, vinyl alcohol based polymers, and combinations thereof. In an implementation, the passivation layer 118 may be formed as a multiple stacked layer including the inorganic and organic insulating layers.

The passivation layer 118 may expose the drain electrode 117 and an organic light-emitting device 120 may connect to the exposed drain electrode 117. The organic light-emitting device 120 may include a first electrode 121, a second electrode 122, and an intermediate layer 123. In an implementation, the first electrode 121 and the drain electrode 117 may contact each other.

The intermediate layer 123 may include an organic emission layer and may emit visible rays when a voltage is applied thereto through the first and second electrodes 121 and 122.

A pixel defining layer 119 may be formed on the first electrode 121 with an insulating material. A predetermined opening may be formed in the pixel defining layer 119 to expose the first electrode 121. The intermediate layer 123 may be formed on the exposed first electrode 121. In addition, the second electrode 122 may connect to the intermediate layer 123.

The first and second electrodes 121 and 122 may have polarities of an anode electrode and a cathode electrode, respectively. However, the polarities of the first and second electrodes 121 and 122 may be changed.

The sealing substrate 102 may be disposed on the second electrode 122.

Although not illustrated in FIGS. 1 through 5, a cutting process for each of the display units 110 may be finally performed to manufacture the flat panel display apparatuses. For example, two flat panel display apparatuses may be obtained from the mother substrate 100 illustrated in FIG. 1.

Figure 6:
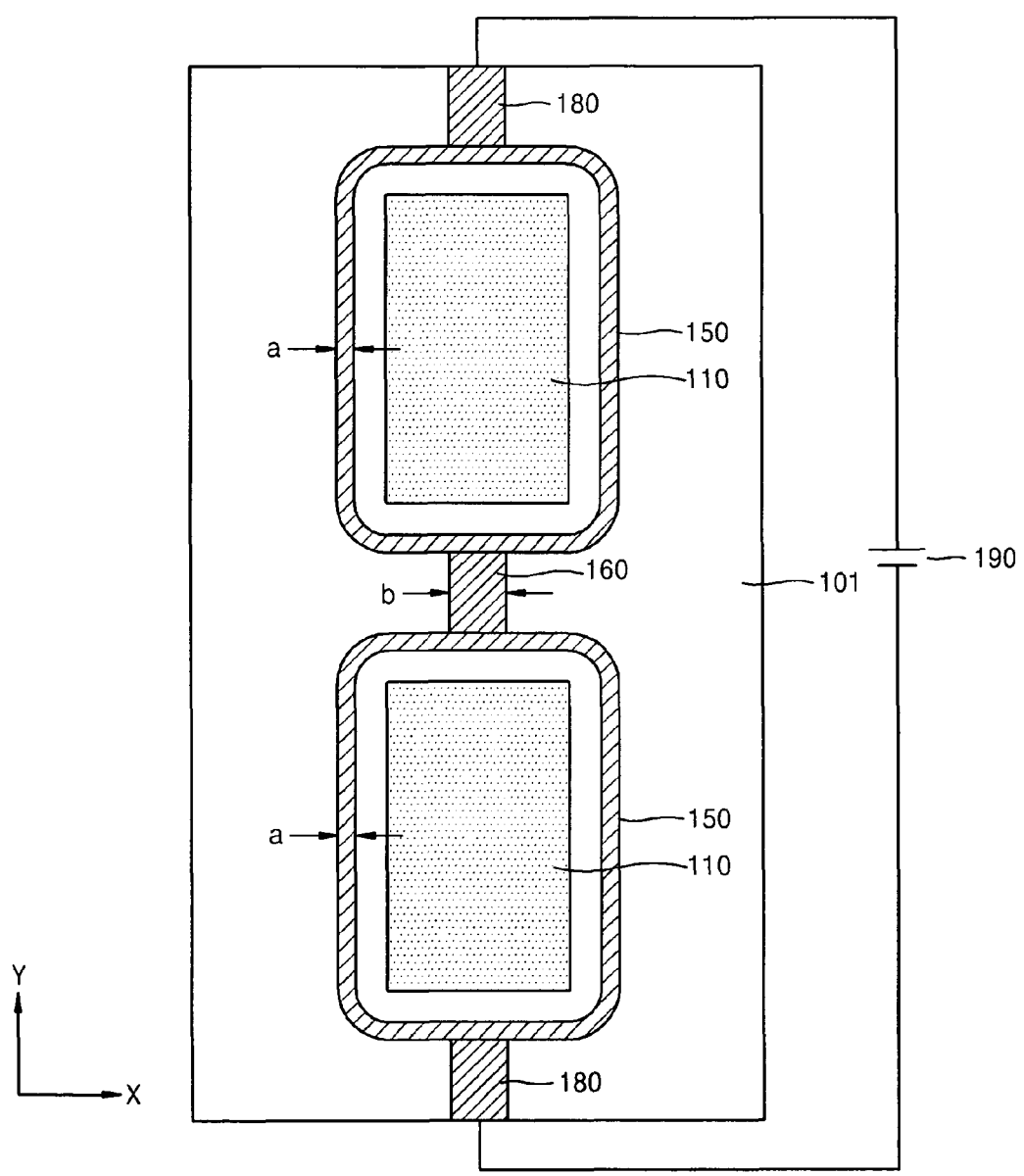
FIG. 6 illustrates a schematic plan view of a process of applying power from a power source to form a sealing member during manufacturing of the mother substrate of FIG. 1.

FIG. 6 illustrates a schematic plan view of a process of applying power from a power source to form the sealing member 170 during manufacturing of the mother substrate 100 of FIG. 1.

Among processes of forming the mother substrate 100 illustrated in FIG. 1, forming the sealing member 170 may include providing a material for forming the sealing member 170 and then melting and hardening the material.

In the melting process, both terminals of a power source 190 may be connected to the inlets 180. Then, when the voltage is applied to the inlets 180, Joule heat may be generated from the wiring units 150. Thus, the material for forming the sealing member 170, which may overlap the wiring unit 150, may be melted. Then, the material may harden to form the sealing member 170. The sealing member 170 may facilitate coupling of the substrate 101 and the sealing substrate 102.

Here, the width "b" of the connecting unit 160 may be about twice the width of the wiring unit 150 or greater so as to adjust the heat generated from the connecting unit 160 and thereby prevent the connecting unit 160 from being damaged by the heat. Therefore, the current may constantly flow through each of the wiring units 150 surrounding the display units 110. Thus, the heat may be constantly generated from each of the wiring units 150.

Therefore, the sealing member 170 may evenly melt and harden, thereby improving a sealing property of the mother substrate 100 for forming the flat panel display apparatus.

Figure 7:
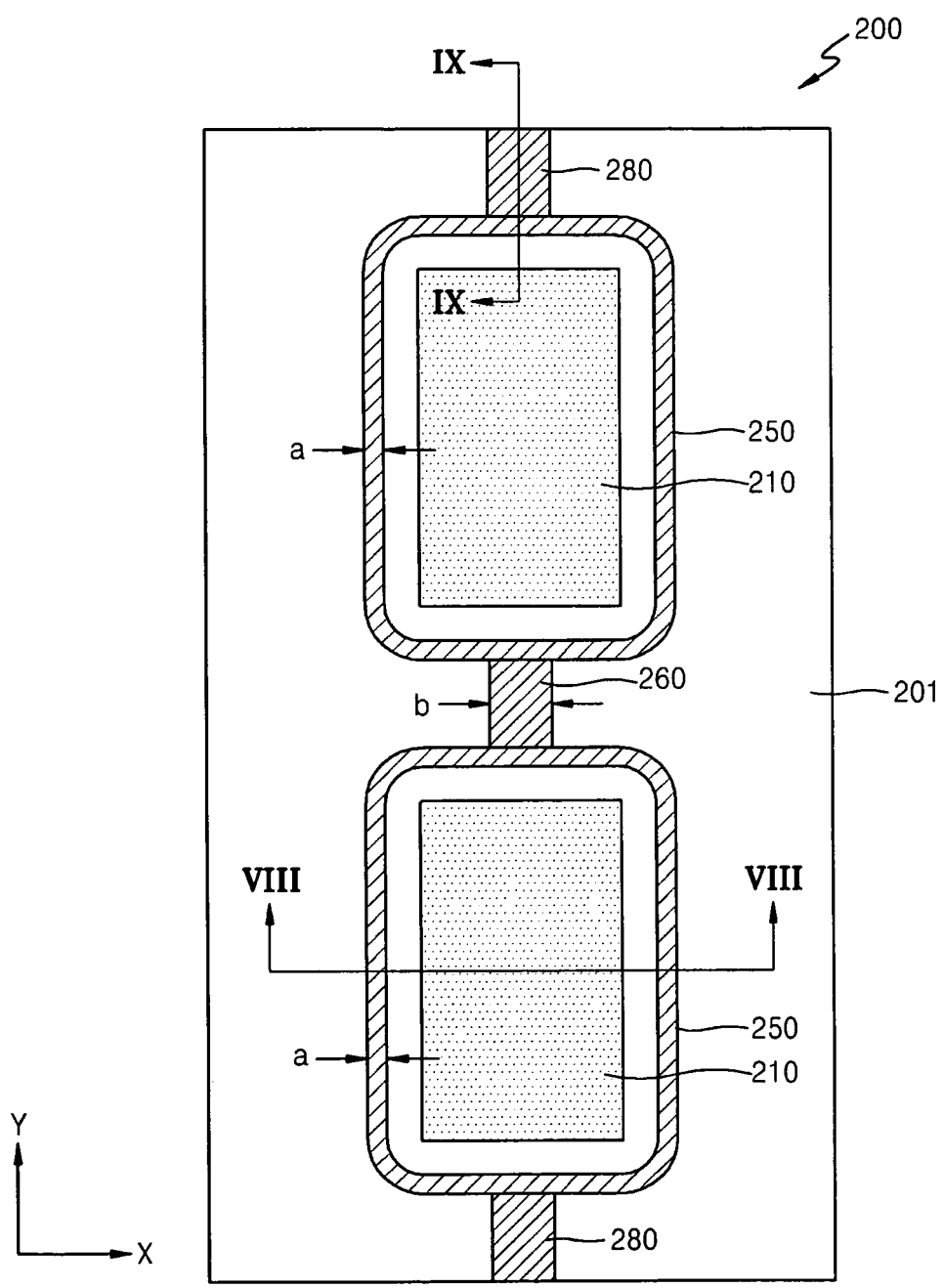
FIG. 7 illustrates a schematic plan view of a mother substrate for a flat panel display apparatus according to another embodiment.
Figure 8:
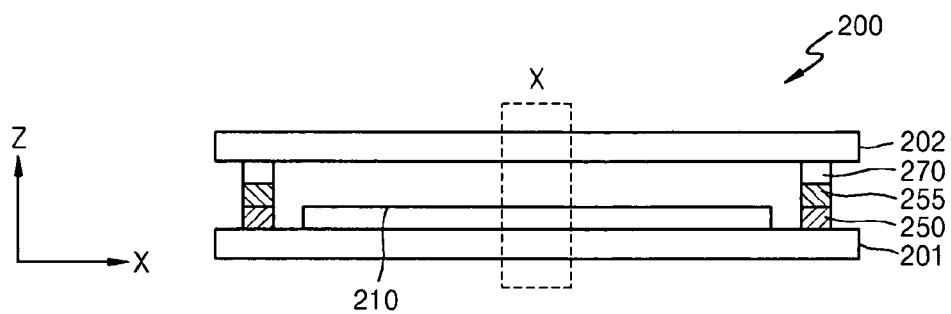
FIG. 8 illustrates a cross-sectional view of the mother substrate taken along line VIII-VIII of FIG. 7.
Figure 9:
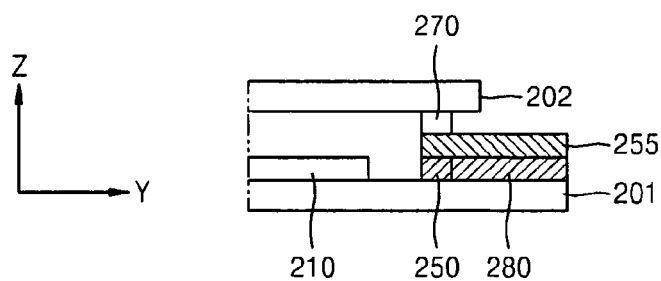
FIG. 9 illustrates a cross-sectional view of the mother substrate taken along line IX-IX of FIG. 7.

FIG. 7 illustrates a schematic plan view of a mother substrate 200 for forming a flat panel display apparatus according to another embodiment. FIG. 8 illustrates a cross-sectional view of the mother substrate 200 taken along line VIII-VIII of FIG. 7. FIG. 9 illustrates a cross-sectional view of the mother substrate 200 taken along line IX-IX of FIG. 7.

Referring to FIGS. 7 through 9, the mother substrate 200 for forming a flat panel display apparatus may include a substrate 201, display units 210, a sealing substrate 202, wiring units 250, a protective layer 255, sealing members 270, a connecting unit 260, and inlets 280. For the convenience of explanation, components that are different from those of the previous embodiment will be described.

The display units 210 may be disposed on the substrate 201. Each of the display units 210 may form a flat panel display apparatus. In FIG. 7, two display units 210 are illustrated. Thus, two flat panel display apparatuses may be fabricated from the mother substrate 200 of the present embodiment.

The sealing substrate 202 may face the display units 210. The sealing members 270 may be disposed between the substrate 201 and the sealing substrate 202. The sealing members 270 may surround the display units 210.

The wiring units 250 may overlap the sealing members 270. That is, the wiring units 250 may also surround the display units 210.

The protective layer 255 may be disposed between the wiring units 250 and the sealing members 270. That is, the wiring units 250 may be formed on the substrate 201, the sealing members 270 may be formed on the sealing substrate 202, and then, the protective layer 255 may be disposed between the wiring units 250 and the sealing members 270. The protective layer 255 may improve adherence or adhesion between the wiring units 250 and the sealing members 270.

The protective layer 255 may also be disposed on the inlets 280 so as to prevent the inlets 280 from being oxidized by moisture and air. The protective layer 255 may include an insulating material, e.g., an oxide.

The wiring units 250 may be arranged in a direction (Y-direction in FIG. 7), and the connecting unit 260 may be disposed between the wiring units 250. The connecting unit 260 may connect adjacent wiring units 250 to each other. A width "b" of the connecting unit 260 may be greater than a width "a" of the wiring units 250.

The inlets 280 may connect to the wiring units 250. The inlets 280 may be formed on end portions of the two wiring units 250 illustrated in FIG. 7. An external power source (not illustrated) may be connected to the inlets 280. In addition, the inlets 280 may have widths greater than widths of the wiring units 250. For example, the width of the inlet 280 may be twice the width of the wiring unit 250 or greater.

Although it is not illustrated in the drawings, the cutting operation for each of the display units 210 may be performed to thereby fabricate the flat panel display apparatuses. For example, two flat panel display apparatuses may be obtained from the mother substrate 200 illustrated in FIG. 7.

Among processes of forming the mother substrate 200 illustrated in FIG. 7, forming the sealing members 270 may include providing a material for forming the sealing members 270 and then melting and hardening the material.

In the melting process, both terminals of a power source (not illustrated) may be connected to the inlets 280. Then, when the voltage is applied to the inlets 280, the wiring units 250 may generate Joule heat. Thus, the material for forming the sealing member 270, which may overlap the wiring unit 250, may be easily melted. Then, the material may harden to form the sealing members 270.

In the present embodiment, the protective layer 255 may be disposed between the wiring units 250 and the sealing members 270 to improve adherence between the wiring units 250 and the sealing members 270 and to improve coupling between the substrate 201 and the sealing substrate 202.

In addition, the protective layer 255 may be formed on upper portions of the inlets 280 so as to prevent the inlets 280 from being damaged.

Therefore, sealing property of the mother substrate 200 for forming a flat panel display apparatus may be improved.

Figure 10:
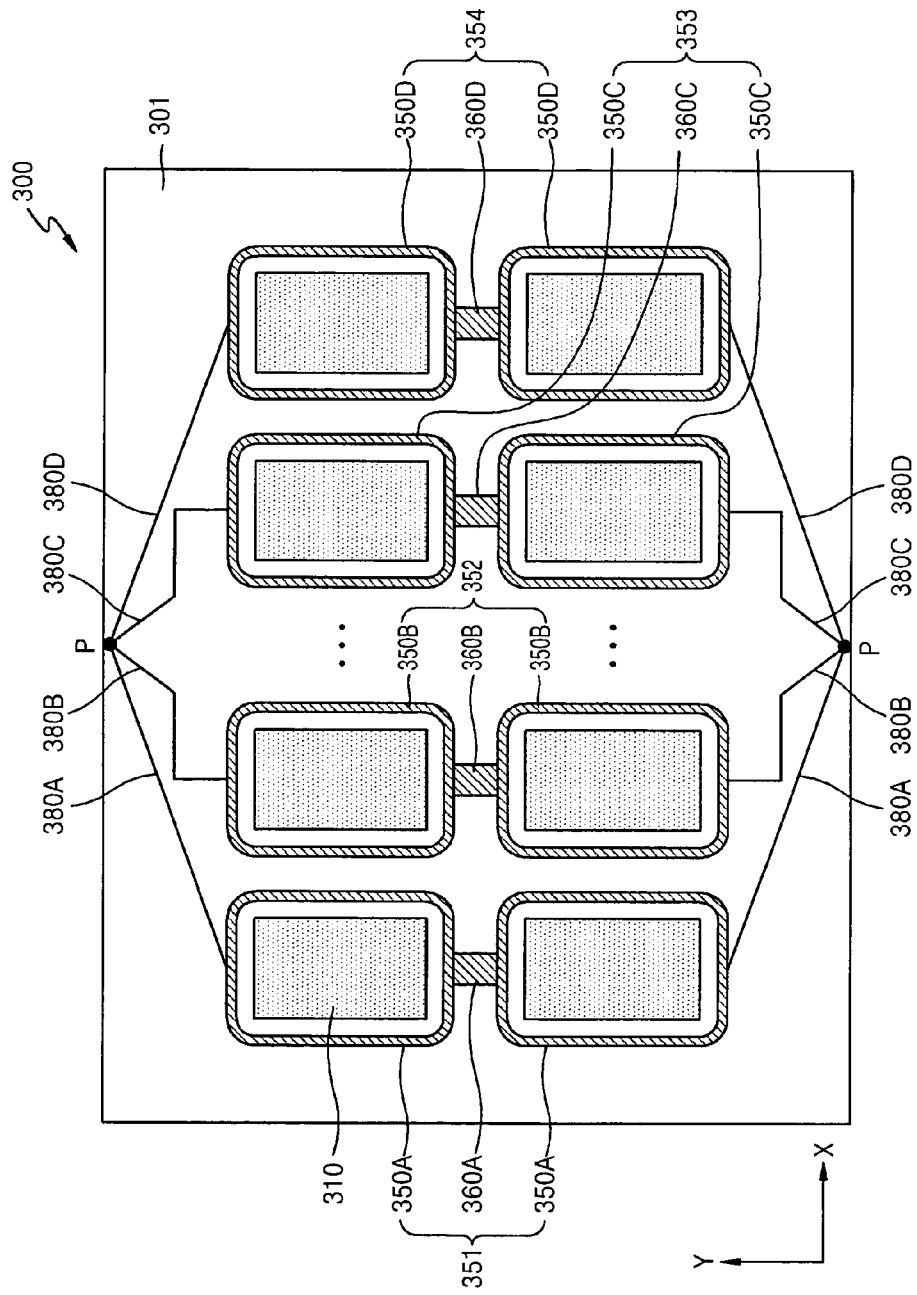
FIG. 10 illustrates a schematic plan view of a mother substrate for a flat panel display apparatus according to yet another embodiment.

FIG. 10 illustrates a schematic plan view of a mother substrate 300 for forming a flat panel display apparatus according to yet another embodiment. For convenience of explanation, components that are different from those of the previous embodiments will be described.

Referring to FIG. 10, the mother substrate 300 for forming a flat panel display apparatus may include the substrate 101, display units 310, a sealing substrate (not illustrated), first through fourth wiring unit groups 351, 352, 353, and 354, a sealing member (not illustrated), connecting units 360A, 360B, 360C, and 360D, first through fourth inlets 380A, 380B, 380C, and 380D, and conductive points P.

The display units 310 may be disposed on the substrate 301. Each of the display units 310 may form a flat panel display apparatus.

The sealing substrate (not illustrated) may face the display units 310. The sealing member (not illustrated) may be disposed between the substrate 301 and the sealing substrate. Configurations of the sealing substrate and the sealing member may be the same as those of the previous embodiments and thus, repeated detailed descriptions thereof will not be provided.

The mother substrate 300 of the present embodiment may include the first wiring unit group 351, the second wiring unit group 352, the third wiring unit group 353, and the fourth wiring unit group 354. However, the embodiments are not limited thereto; and the mother substrate 300 may include, e.g., five or more wiring unit groups.

The first wiring unit group 351 may include a plurality of wiring units 350A arranged in a direction (Y direction of FIG. 10) as well as the connecting unit 360A connecting the wiring units 350A to each other. In FIG. 10, two wiring units 350A and one connecting unit 360A are illustrated. However, the embodiments are not limited thereto and, e.g., three or more wiring units 350A and connecting units 360A may be formed. The connecting unit 360A may have a width greater than a width of the wiring unit 350A, e.g., the width of the connecting unit 360A may be about twice the width of the wiring unit 350A or greater.

The second wiring unit group 352 may include a plurality of wiring units 350B arranged in a direction (Y direction of FIG. 10) as well as the connecting unit 360B. The connecting unit 360B may have a width greater than that of the wiring unit 350B, e.g., about twice the width of the wiring unit 350B or greater.

The third wiring unit group 353 may include a plurality of wiring units 350C arranged in a direction (Y direction of FIG. 10) as well as the connecting unit 360C. The connecting unit 360C may have a width greater than that of the wiring unit 350C, e.g., about twice the width of the wiring unit 350C or greater.

The fourth wiring unit group 354 may include a plurality of wiring units 350D arranged in a direction (Y direction of FIG. 10) as well as a connecting unit 360D. The connecting unit 360D may have a width greater than that of the wiring unit 350D, e.g., about twice the width of the wiring unit 350D or greater.

The first through fourth wiring unit groups 351, 352, 353, and 354 may be arranged in another direction (X direction of FIG. 10) that crosses the direction (Y direction of FIG. 10) in which the wiring units are arranged in each group.

The conductive points P may be disposed above and below, i.e., may face opposite sides of, the first through fourth wiring unit groups 351, 352, 353, and 354. The conductive points P may be connected to an external power source (not illustrated) that may apply a voltage to each of the wiring units during forming of the sealing member (not illustrated).

The first wiring unit group 351 may be connected to the conductive point P via the first inlet 380A, the second wiring unit group 352 may be connected to the conductive point P via the second inlet 380B, the third wiring unit group 353 may be connected to the conductive point P via the third inlet 380C, and the fourth wiring unit group 354 may be connected to the conductive point P via the fourth inlet 380D.

Each of the first through fourth inlets 380A, 380B, 380C, and 380D may include a conductive material so that the voltage applied via the conductive point P may be transmitted to each of the first through fourth wiring unit groups 351, 352, 353, and 354.

In addition, the first through fourth inlets 380A, 380B, 380C, and 380D may have the same lengths. Therefore, when voltage is supplied via the conductive point P, magnitudes of voltage drops (IR drop) in the first through fourth inlets 380A, 380B, 380C, and 380D may be controlled to be the same as each other.

Figure 11:
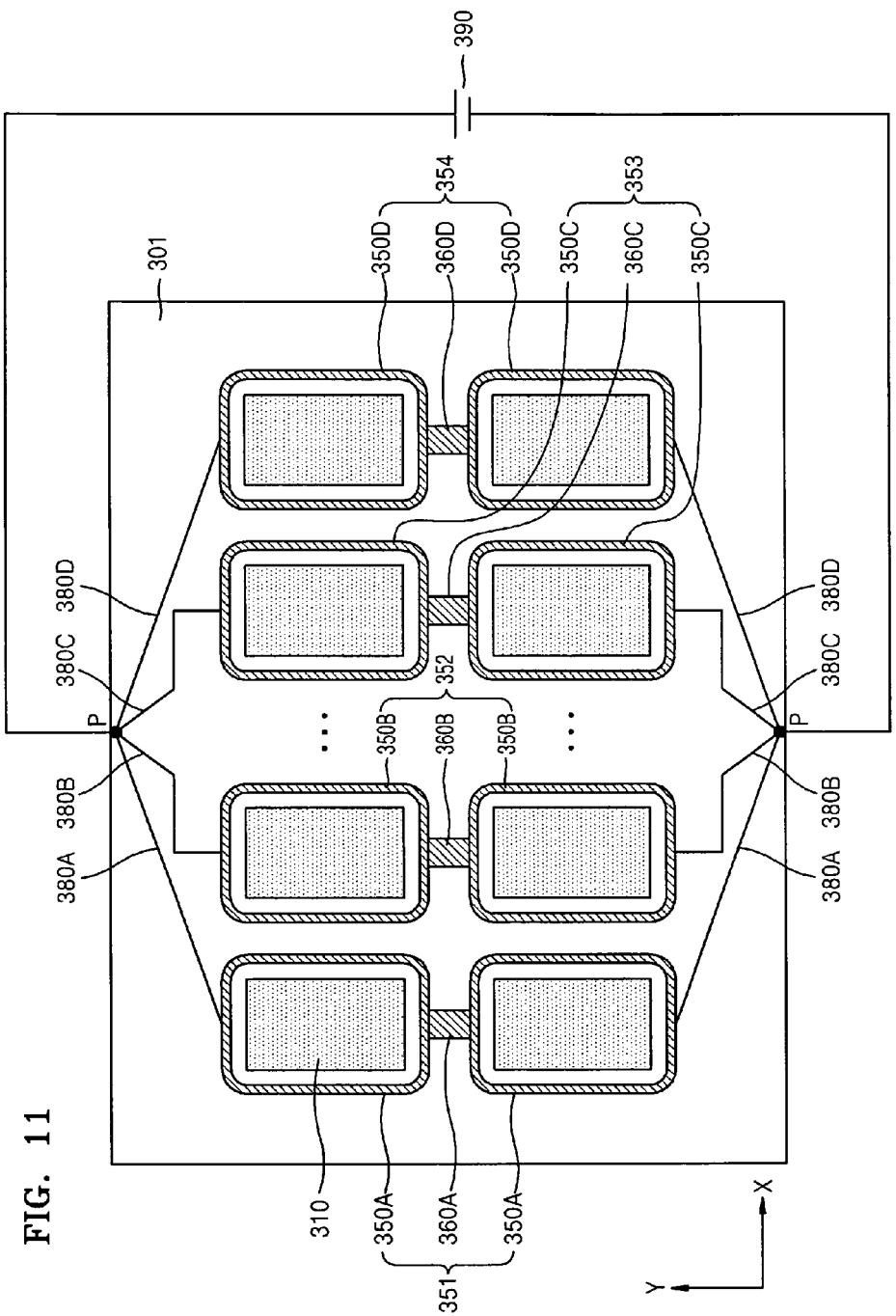
FIG. 11 illustrates a schematic plan view showing a process of applying power from a power source to form a sealing member during manufacturing of the flat panel display apparatus of FIG. 10.

FIG. 11 illustrates a schematic plan view of a process of applying power from a power source to form the sealing member when the mother substrate 300 for forming a flat panel display apparatus is fabricated.

Among the processes of forming the mother substrate 300 of FIG. 10, forming the sealing member (not illustrated) may include providing a material for forming the sealing member (not illustrated) and then melting and hardening the material for forming the sealing member.

In the process of melting the material, both terminals of a power source 390 may be connected to the conductive points P. The conductive points P and the first through fourth wiring unit groups 351, 352, 353, and 354 may be connected to each other via the first through fourth inlets 380A, 380B, 380C, and 380D. In addition, the power source 390 may apply the voltage to the wiring units 350A, 350B, 350C, and 350D of the first through fourth wiring unit groups 351, 352, 353, and 354.

Here, the first through fourth wiring unit groups 351, 352, 353, and 354 may be separated at different distances from the conductive points P. Thus, there may be a difference between the IR drop in each of the first through fourth wiring unit groups 351, 352, 353, and 354. However, according to the present embodiment, the lengths of the first through fourth inlets 380A, 380B, 380C, and 380D may be the same. Thus, the IR drop in the first through fourth inlets 380A, 380B, 380C, and 380D may be adjusted to be the same therebetween.

Therefore, the voltage may be equally applied to the first through fourth wiring unit groups 351, 352, 353, and 354, and the wiring units 350A, 350B, 350C, and 350D may generate heat evenly.

Figure 12:
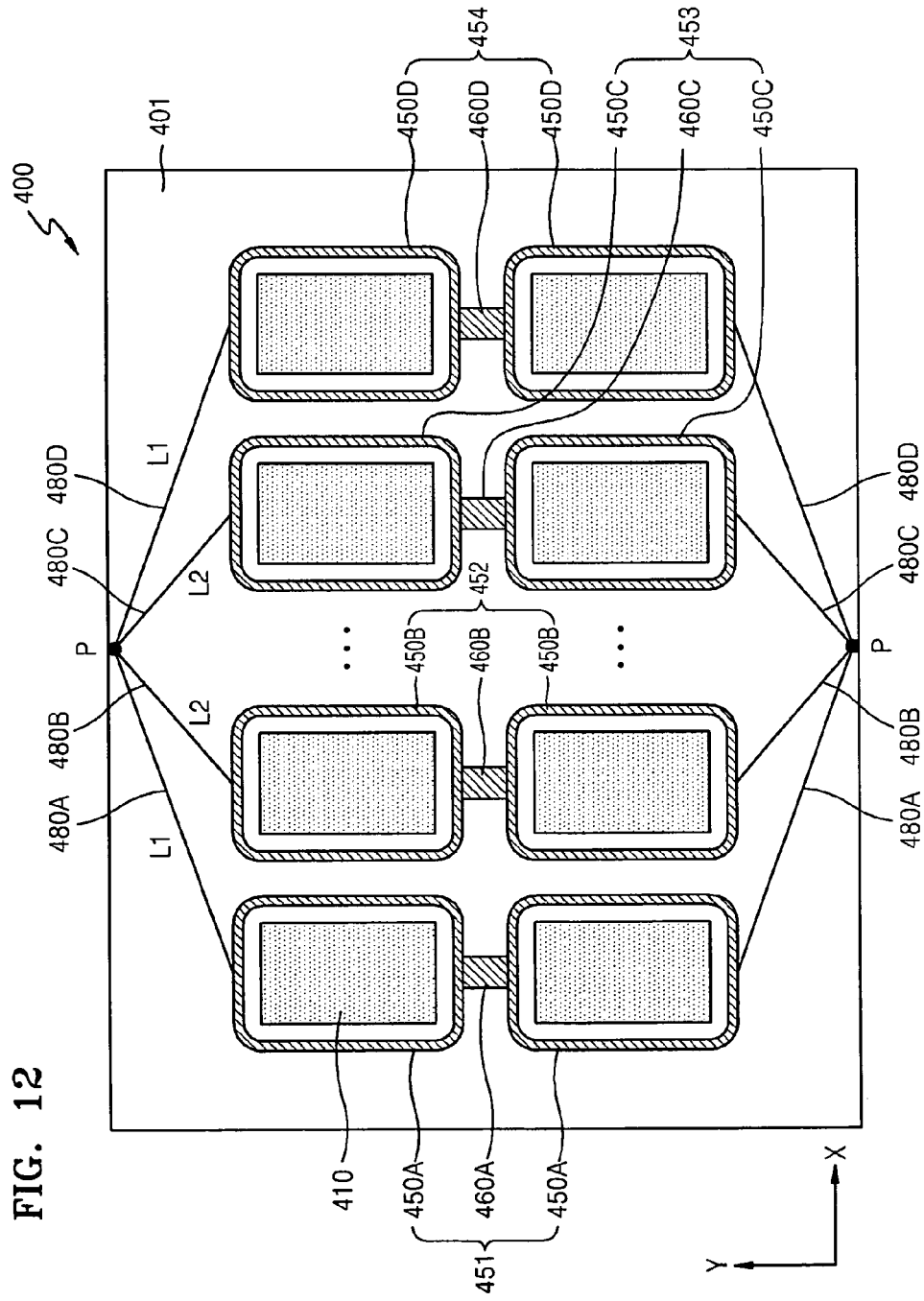
FIG. 12 illustrates a schematic plan view of a mother substrate for a flat panel display apparatus according to still another embodiment.

FIG. 12 illustrates a schematic plan view of a mother substrate 400 for forming a flat panel display apparatus according to still another embodiment. For the convenience of explanation, components that are different from those of the previous embodiments will be described.

Referring to FIG. 12, the mother substrate 400 for forming a flat panel display apparatus may include a substrate 401, display units 510, a sealing substrate (not illustrated), first through fourth wiring unit groups 451, 452, 453, and 454, a sealing member (not illustrated), connecting units 460A, 460B, 460C, and 460D, first through fourth inlets 480A, 480B, 480C, and 480D, and conductive points P.

The display units 410 may be disposed on the substrate 401. Each of the display units 410 may form a flat panel display apparatus.

The sealing substrate (not shown) may face the display units 410. The sealing member (not shown) may be disposed between the substrate 401 and the sealing substrate. Configurations of the sealing substrate and the sealing member may be the same as those of the previous embodiments, and thus, repeated detailed descriptions thereof will not be provided.

The mother substrate 400 of the present embodiment may include the first wiring unit group 451, the second wiring unit group 452, the third wiring unit group 453, and the fourth wiring unit group 454. However, the embodiments are not limited thereto; and the mother substrate 400 may include, e.g., five or more wiring unit groups.

The first wiring unit group 451 may include a plurality of wiring units 450A arranged in a direction (Y direction of FIG. 12) as well as the connecting unit 460A for connecting the wiring units 450A to each other. The connecting unit 460A may have a width greater than a width of the wiring unit 450A, e.g., about twice the width of the wiring unit 450A or greater.

The second wiring unit group 452 may include a plurality of wiring units 450B arranged in a direction (Y direction of FIG. 12) as well as the connecting unit 460B for connecting the wiring units 450B to each other. The connecting unit 460B may have a width greater than that of the wiring unit 450B, e.g., about twice the width of the wiring unit 450B or greater.

The third wiring unit group 453 may include a plurality of wiring units 450C arranged in a direction (Y direction of FIG. 12) as well as the connecting unit 460C for connecting the wiring units 450C to each other. The connecting unit 460C may have a width greater than that of the wiring unit 450C, e.g., about twice the width of the wiring unit 450C or greater.

The fourth wiring unit group 454 may include a plurality of wiring units 450D arranged in a direction (Y direction of FIG. 12) as well as the connecting unit 460D for connecting the wiring units 450D to each other. The connecting unit 460D may have a width greater than that of the wiring unit 450D, e.g., about twice the width of the wiring unit 450D or greater.

The first through fourth wiring unit groups 451, 452, 453, and 454 may be arranged in another direction (X direction of FIG. 12) that crosses the direction (Y direction of FIG. 12) in which the wiring units are arranged in each group.

The conductive points P may be disposed above and below, i.e., may face opposite sides of, the first through fourth wiring unit groups 451, 452, 453, and 454. The first wiring unit group 451 may be connected to the conductive point P via the first inlet 480A, the second wiring unit group 452 may be connected to the conductive point P via the second inlet 480B, the third wiring unit group 453 may be connected to the conductive point P via the third inlet 480C, and the fourth wiring unit group 454 may be connected to the conductive point P via the fourth inlet 480D.

The first through fourth inlets 480A, 480B, 480C, and 480D may not have the same lengths. For example, lengths of the first and fourth inlets 480A and 480D respectively connected to the first and fourth wiring unit groups 451 and 454, which are further from the conductive points P, may be longer than lengths of the second and third inlets 480B and 480C respectively connected to the second and third wiring unit groups 452 and 453, which are close to the conductive points P.

Here, thicknesses of the second and third inlets 480B and 480C may be less than thicknesses of the first and fourth inlets 480A and 480D. That is, as the length of each of the first through fourth inlets 480A, 480B, 480C, and 480D is increased, the thickness of the first, second, third, or fourth inlet 480A, 480B, 480C, or 480D may also increase.

Therefore, magnitudes of an IR drop in each of the first through fourth inlets 480A, 480B, 480C, and 480D when the voltage is applied through the conductive points P may be adjusted to be the same.

Figure 13:
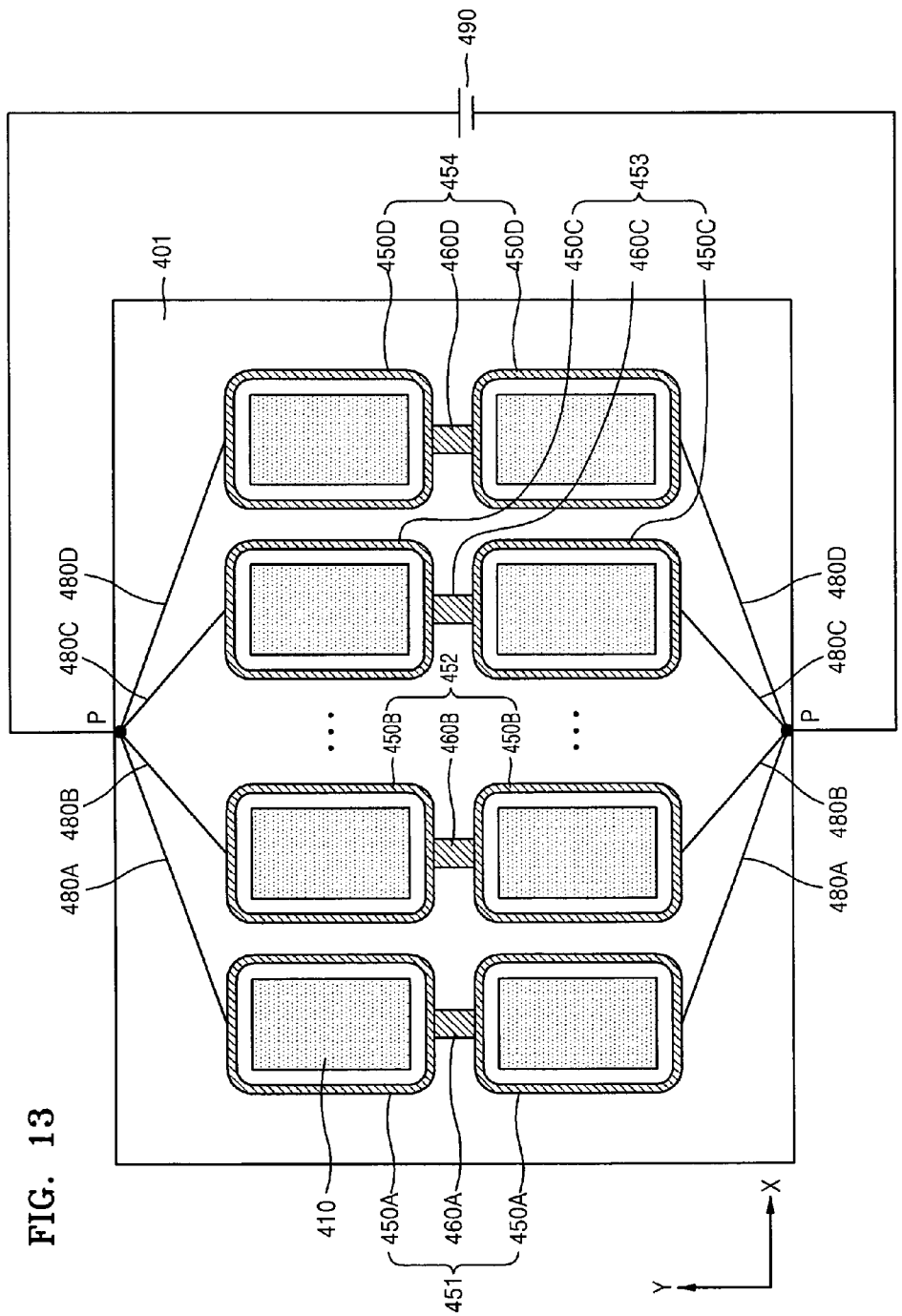
FIG. 13 illustrates a schematic plan view illustrating a process of applying power from a power source to form a sealing member during manufacturing of the mother substrate of FIG. 12.

FIG. 13 illustrates a schematic plan view of a process of applying power from a power source to form the sealing member when the mother substrate 400 of FIG. 12 is fabricated.

Among the processes of forming the mother substrate 400 of FIG. 12, forming the sealing member (not shown) may include providing a material for forming the sealing member (not shown) and then melting and hardening the material for forming the sealing member.

In the melting process, both terminals of a power source 490 may be connected to the conductive points P, and the conductive points P and the first through fourth wiring unit groups 451, 452, 453, and 454 may be connected to each other via the first through fourth inlets 480A, 480B, 480C, and 480D.

In addition, the power source 490 may apply power to the wiring units 450A, 450B, 450C, and 450D of the first through fourth wiring units groups 451, 452, 453, and 454.

Here, since the first through fourth wiring unit groups 451, 452, 453, and 454 may be separated from the conductive points P by different distances, lengths of the first through fourth inlets 480A, 480B, 480C, and 480D may be different from each other. Thus, there may be a difference between the IR drops in the first through fourth inlets 480A, 480B, 480C, and 480D. However, according to the present embodiment, the thickness of the first, second, third, or fourth inlet 480A, 480B, 480C, or 480D may be increased as the length of the first, second, third, or fourth inlet 480A, 480B, 480C, or 480D is increased so as to constantly adjust the voltage drop in each of the first through fourth inlets 480A, 480B, 480C, and 480D.

Therefore, even when a like voltage is applied to each of the first through fourth wiring unit groups 451, 452, 453, and 454, heat generated from the wiring units 450A, 450B, 450C, and 450D may be controlled to be equal to each other.

Figure 14:
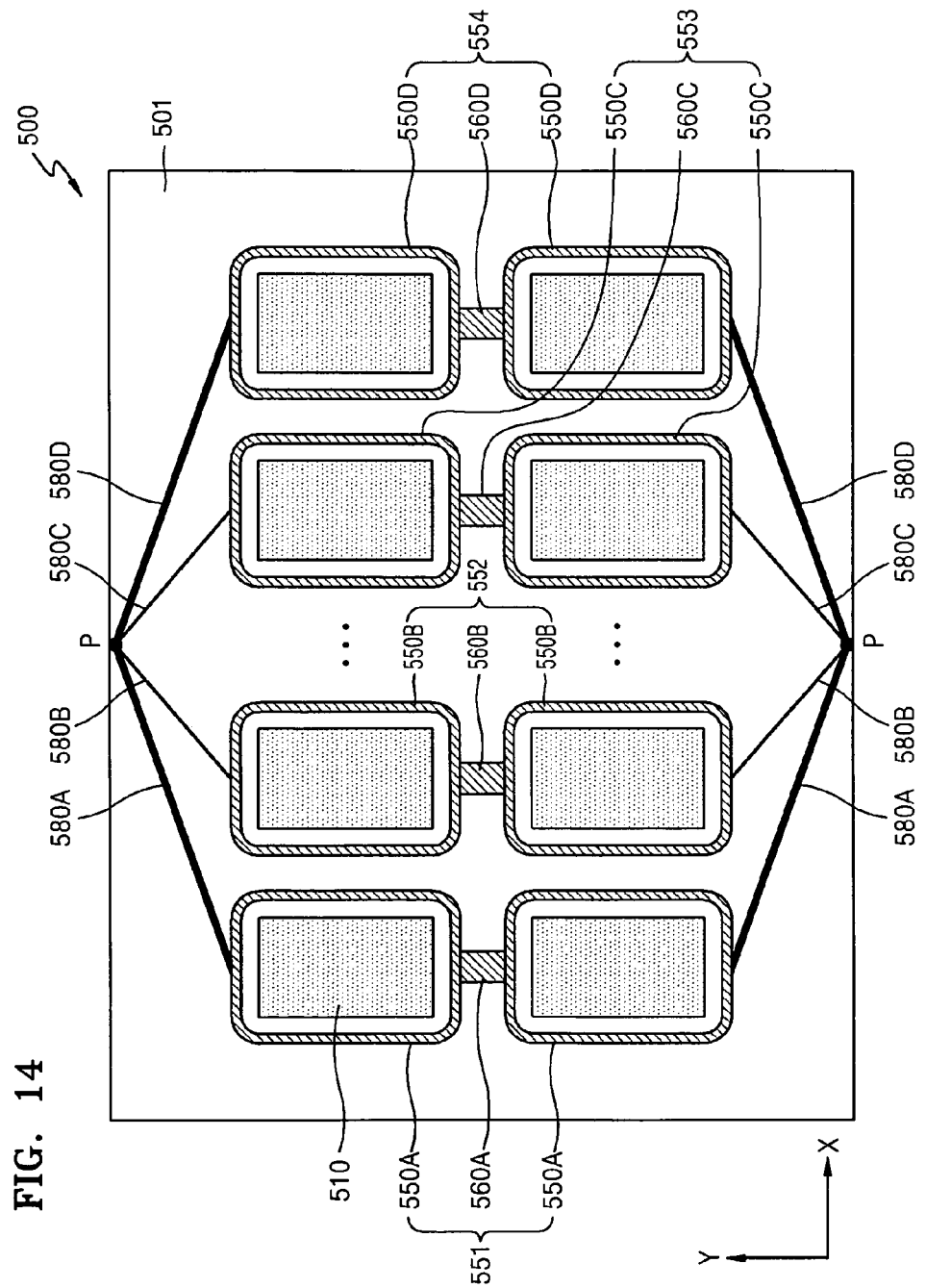
FIG. 14 illustrates a schematic plan view of a mother substrate for a flat panel display apparatus according to still another embodiment.

FIG. 14 illustrates a schematic plan view of a mother substrate 500 for forming a flat panel display apparatus according to still another embodiment. Components that are different from those of the previous embodiments will be described.

Referring to FIG. 14, the mother substrate 500 for forming a flat panel display apparatus may include a substrate 501, display units 510, a sealing substrate (not shown), first through fourth wiring unit groups 551, 552, 553, and 554, a sealing member (not shown), connecting units 560A, 560B, 560C, and 560D, first through fourth inlets 580A, 580B, 580C, and 580D, and conductive points P.

The display units 510 may be disposed on the substrate 501. Each of the display units 510 may form a flat panel display apparatus.

The sealing substrate (not shown) may face the display units 510. The sealing member (not shown) may be between the substrate 501 and the sealing substrate (not shown). Configurations of the sealing substrate and the sealing member may be the same as those of the previous embodiments, and thus, repeated detailed descriptions thereof will not be provided.

The mother substrate 500 of the present embodiment may include the first wiring unit group 551, the second wiring unit group 552, the third wiring unit group 553, and the fourth wiring unit groups 554. However, the embodiments are not limited thereto; and the mother substrate may include, e.g., five or more wiring unit groups.

The first wiring unit group 551 may include a plurality of wiring units 550A that are arranged in a direction (Y direction of FIG. 14) as well as the connecting unit 560A. The connecting unit 560A may have a width that is greater than that of the wiring unit 550A, e.g., about twice the width of the wiring unit 550A or greater.

The second wiring unit group 552 may include a plurality of wiring units 550B that are arranged in a direction (Y direction of FIG. 14) as well as the connecting unit 560B. The connecting unit 560B may have a width that is greater than that of the wiring unit 550B, e.g., about twice the width of the wiring unit 550B or greater.

The third wiring unit group 553 may include a plurality of wiring units 550C that are arranged in a direction (Y direction of FIG. 14) as well as the connecting unit 560C. The connecting unit 560C may have a width that is greater than that of the wiring unit 550C, e.g., about twice the width of the wiring unit 550C or greater.

The fourth wiring unit group 554 may include a plurality of wiring units 550D that are arranged in a direction (Y direction of FIG. 14) as well as the connecting unit 560D. The connecting unit 560D may have a width that is greater than that of the wiring unit 550D, e.g., about twice the width of the wiring unit 550D or greater.

The first through fourth wiring unit groups 551, 552, 553, and 554 may be arranged in another direction (X direction in FIG. 14) crossing the direction in which the wiring units are arranged in each of the first through fourth wiring groups 551, 552, 553, and 554

The conductive points P may be disposed above and below, i.e., may face opposite sides of, the first through fourth wiring unit groups 551, 552, 553, and 554. The first wiring unit group 551 may be connected to the conductive point P via the first inlet 580A, the second wiring unit group 552 may be connected to the conductive point P via the second inlet 580B, the third wiring unit group 553 may be connected to the conductive point P via the third inlet 580C, and the fourth wiring unit group 554 may be connected to the conductive point P via the fourth inlet 580D.

The first through fourth inlets 580A, 580B, 580C, and 580D may not have the same lengths. For example, lengths of the first and fourth inlets 580A and 580D respectively connected to the first and fourth wiring unit groups 551 and 554, which are further from the conductive points P, may be longer than lengths of the second and third inlets 580B and 580C respectively connected to the second and third wiring unit groups 552 and 553, which are closer to the conductive points P.

Here, widths of the second and third inlets 580B and 580C may be less than widths of the first and fourth inlets 580A and 580D. For example, as the length of each of the first through fourth inlets 580A, 580B, 580C, and 580D is increased, the width of the first, second, third, or fourth inlet 580A, 580B, 580C, or 580D may also increase.

Referring to FIG. 14, each of the first through fourth inlets 580A, 580B, 580C, and 580D may have a constant width from an end connected to each of the first through fourth wiring unit groups 551, 552, 553, and 554 and to the other end connected to the conductive point P. However, the embodiments are not limited thereto; and each of the first through fourth inlets 580A, 580B, 580C, and 580D may have a variable width. In this case, a width per unit length of each of the through fourth inlets 580A, 580B, 580C, and 580D may be defined as an average width of each of the through fourth inlets 580A, 580B, 580C, and 580D, and the average width of each of the first through fourth inlets 580A, 580B, 580C, and 580D may be increased as the length of the first, second, third, or fourth inlet 580A, 580B, 580C, or 580D is increased.

Therefore, magnitudes of voltage drops (IR drop) in the first through fourth inlets 580A, 580B, 580C, and 580D may be controlled to be equal to each other when like voltages are applied via the conductive points P to the first through fourth wiring unit groups 551, 552, 553, and 554.

Figure 15:
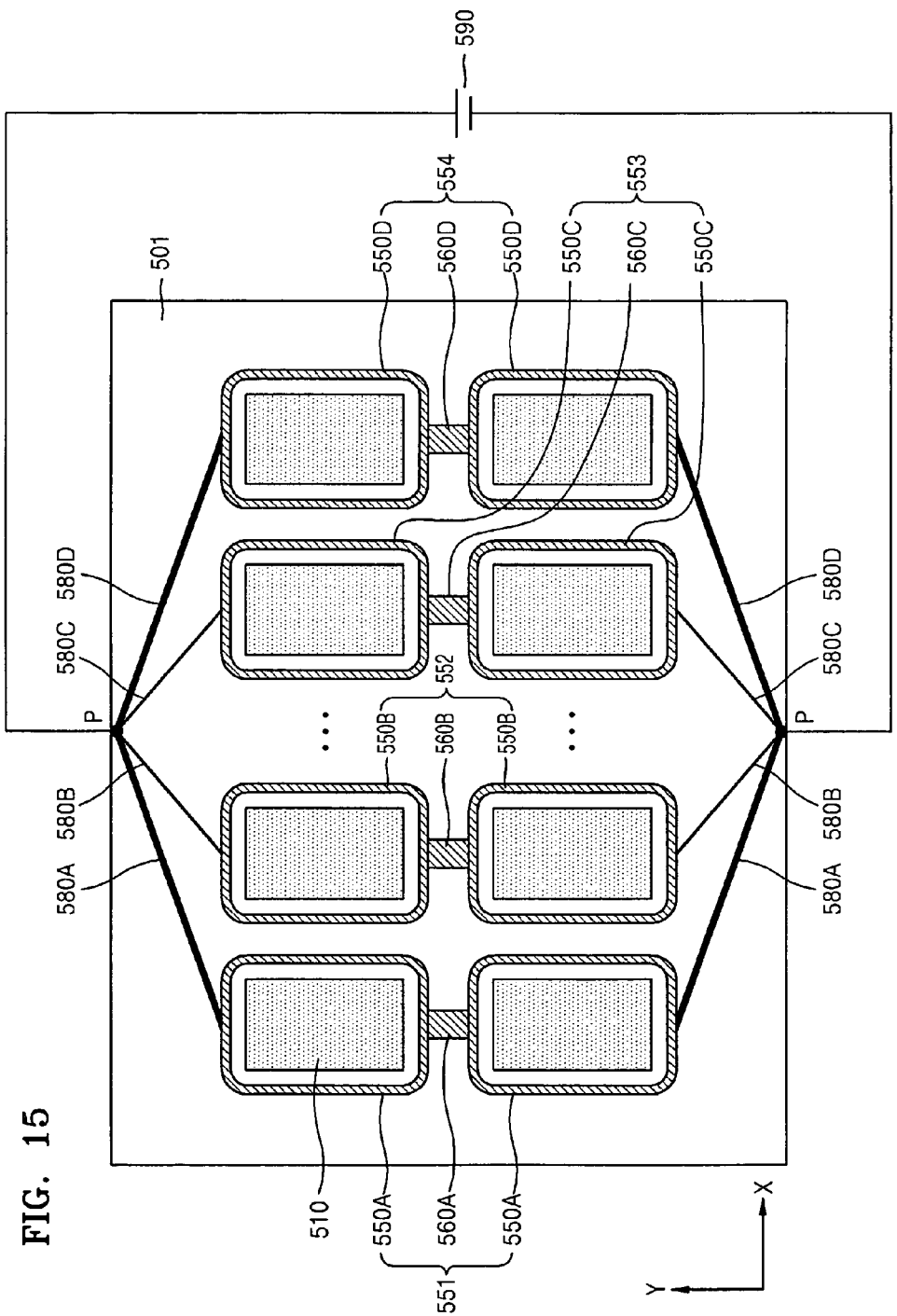
FIG. 15 illustrates a schematic plan view illustrating a process of applying power from a power source to form a sealing member during manufacturing of the mother substrate of FIG. 14.

FIG. 15 illustrates a schematic plan view of a process of applying power from a power source to form the sealing member when the mother substrate 500 of FIG. 14 is fabricated.

Among the processes of forming the mother substrate 500 of FIG. 14, forming the sealing member (not shown) may include providing a material for forming the sealing member (not shown) and then melting and hardening the material for forming the sealing member.

In the melting process, both terminals of a power source 590 may be connected to the conductive points P; and the conductive points P and the first through fourth wiring unit groups 551, 552, 553, and 554 may be connected to each other via the first through fourth inlets 580A, 580B, 580C, and 580D. In addition, the power source 590 may apply voltages to the wiring units 550A, 550B, 550C, and 550D of the first through fourth wiring unit groups 551, 552, 553, and 554.

Since the first through fourth wiring unit groups 551, 552, 553, and 554 may be separated from the conductive points P by different distances, the lengths of the first through fourth inlets 580A, 580B, 580C, and 580D may be different from each other. Thus, there may be a difference between the IR drops in the first through fourth inlets 580A, 580B, 580C, and 580D. However, in the present embodiment, the width of the first, second, third, or fourth inlet 580A, 580B, 580C, or 580D may be increased as the length of the first, second, third, or fourth inlet 580A, 580B, 580C, or 580D is increased so as to constantly adjust the voltage drop in each of the first through fourth inlets 580A, 580B, 580C, and 580D.

Therefore, the same voltage may be applied to each of the first through fourth wiring unit groups 551, 552, 553, and 554. Thus, the heat generated from the wiring units 550A, 550B, 550C, and 550D may be adjusted to be equal to each other.

Figure 16:
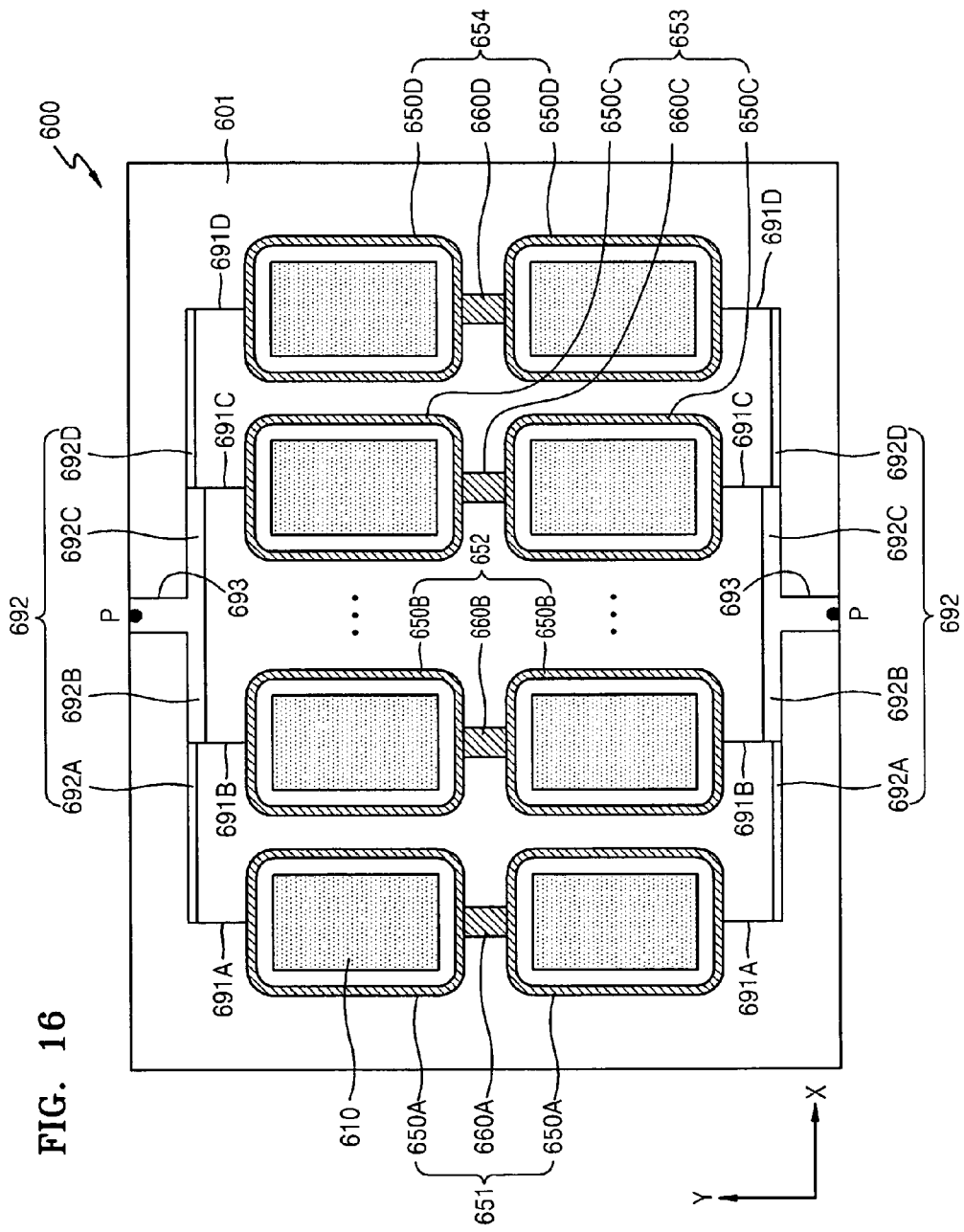
FIG. 16 illustrates a schematic plan view of a mother substrate for a flat panel display apparatus according to still another embodiment.

FIG. 16 illustrates a schematic plan view of a mother substrate 600 for forming a flat panel display apparatus according to still another embodiment. For the convenience of explanation, components that are different from those of the previous embodiments will be described.

Referring to FIG. 16, the mother substrate 600 for forming a flat panel display apparatus may include a substrate 601, display units 610, a sealing substrate (not shown), first through fourth wiring unit groups 651, 652, 653, and 654, a sealing member (not shown), connecting units 660A, 660B, 660C, and 660D, first through fourth branching lines 691A, 691B, 691C, and 691D, an extension unit 692 including first through fourth extension units 692A, 692B, 692C, and 692D, a center unit 693, and conductive points P.

The display units 610 may be disposed on the substrate 601. Each of the display units 610 may form a flat panel display apparatus.

The sealing substrate (not shown) may face the display units 610. The sealing member (not shown) may be disposed between the substrate 601 and the sealing substrate (not shown). Configurations of the sealing substrate and the sealing member may be the same as those of previous embodiments, and thus, repeated detailed descriptions thereof will not be provided.

The mother substrate 600 of the present embodiment may include the first wiring unit group 651, the second wiring unit group 652, the third wiring unit group 653, and the fourth wiring unit groups 654. However, the embodiments are not limited thereto; and the mother substrate 600 may include, e.g., five or more wiring unit groups.

The first wiring unit group 651 may include a plurality of wiring units 650A that are arranged in a direction (Y direction of FIG. 16) as well as the connecting unit 660A for connecting the wiring units 650A to each other. The connecting unit 660A may have a width that is greater than that of the wiring unit 650A, e.g., about twice the width of the wiring unit 650A or greater.

The second wiring unit group 652 may include a plurality of wiring units 650B that are arranged in a direction (Y direction of FIG. 16) as well as the connecting unit 660B for connecting the wiring units 650B to each other. The connecting unit 660B may have a width that is greater than that of the wiring unit 650B, e.g., about twice the width of the wiring unit 650B or greater.

The third wiring unit group 653 may include a plurality of wiring units 650C that are arranged in a direction (Y direction of FIG. 16) as well as the connecting unit 660C for connecting the wiring units 650C to each other. The connecting unit 660C may have a width that is greater than that of the wiring unit 650C, e.g., about twice the width of the wiring unit 650C or greater.

The fourth wiring unit group 654 may include a plurality of wiring units 650D that are arranged in a direction (Y direction of FIG. 16) as well as the connecting unit 660D for connecting the wiring units 650D to each other. The connecting unit 660D may have a width that is greater than that of the wiring unit 650D, e.g., about twice the width of the wiring unit 650D or greater.

The first through fourth wiring unit groups 651, 652, 653, and 654 may be arranged in another direction (X direction in FIG. 16) crossing the direction in which the wiring units are arranged in each of the first through fourth wiring groups 651, 652, 653, and 654.

The conductive points P may be disposed above and below, i.e., may face opposite sides of, the first through fourth wiring unit groups 651, 652, 653, and 654. The first through fourth wiring unit groups 651, 652, 653, and 654 and the conductive points P may be connected to each other via the first through fourth branching lines 691A, 691B, 691C, and 691D, as will be described in more detail below.

The first through fourth branching lines 691A, 691B, 691C, and 691D may be formed at end portions of the first through fourth wiring unit groups 651, 652, 653, and 654. For example, the first branching line 691A may be formed at the end portion of the first wiring unit group 651, the second branching line 691B may be formed at the end portion of the second wiring unit group 652, the third branching line 691C may be formed at the end portion of the third wiring unit group 653, and the fourth branching line 691D may be formed at the end portion of the fourth wiring unit group 654.

The first through fourth extension units 692A, 692B, 692C, and 692D of the extension unit 692 may connect to end portions of the first through fourth branching lines 691A, 691B, 691C, and 691D. The first through fourth extension units 692A, 692B, 692C, and 692D and the conductive points P may be connected to each other via the center portions 693. The extension unit 692 may include the first extension unit 692A between the first and second branching lines 691A and 691B, the second extension unit 692B between the second branching line 691B and the center unit 693, the third extension unit 692C between the center unit 693 and the third branching line 691C, and the fourth extension unit 692D between the third and fourth branching lines 691C and 691D.

For example, the first inlet between the conductive point P and the first wiring unit group 651 may include the first branching line 691A, the first extension unit 692A, the second extension unit 692B, and the center unit 693. The second inlet between the conductive point P and the second wiring unit group 652 may include the second branching line 691B, the second extension unit 692B, and the center unit 693. The third inlet between the conductive point P and the third wiring unit group 653 may include the third branching line 691C, the third extension unit 692C, and the center unit 693. The fourth inlet between the conductive point P and the fourth wiring unit group 654 may include the fourth branching line 691D, the fourth extension unit 692D, the third extension unit 692C, and the center unit 693.

A width of each of the first through fourth extension units 692A, 692B, 692C, and 692D may be less the further the first through fourth extension unit 692A, 692B, 692C, and 692D are from the center unit 693. For example, as illustrated in FIG. 16, widths of the second and third extension units 692B and 692C may be greater than widths of the first and fourth extension units 692A and 692D.

When the sealing member is formed, a power source may apply power to the first through fourth wiring unit groups 650A, 650B, 650C, and 650D via the conductive points P, the center units 693, the first through fourth extension units 692A, 692B, 692C, and 692D, and the first through fourth branching lines 691A, 691B, 691C, and 691D so that electric current flows through the first through fourth wiring unit groups 650A, 650B, 650C, and 650D. In more detail, the current flowing through the first branching line 691A may flow through the first extension unit 692A, and the current flowing through the first and second branching lines 691A and 691B may flow through the second extension units 692B. In addition, the current flowing through the fourth branching line 691D may flow through the fourth extension unit 692D, and the current flowing through the third and fourth branching lines 691C and 691D may flow through the third extension unit 692C. When like voltages are applied to the first through fourth wiring unit groups 651, 652, 653, and 654 via the conductive points P in order for the necessary current to flow through each of the first through fourth wiring unit groups 651, 652, 653, and 654, loads that are greater than those of the first and fourth extension units 692A and 692D may be applied to the second and third extension units 692B and 692C that are closer to the center unit 693. Therefore, the second and third extension units 692B and 692C may generate more heat and current of a desired amount may not flow through the second and third extension units 692B and 692C or the second and third extension units 692B and 692C may be damaged.

However, in the present embodiment, the width of each of the first, second, third, or fourth extension units 692A, 692B, 692C, and 692D may be reduced the further the first through fourth extension units 692A, 692B, 692C, and 692D are from the center unit 693. That is, the widths of the second and third extension units 692B and 692C may be greater than those of the first and fourth extension units 692A and 692D. Therefore, the first through fourth extension units 692A, 692B, 692C, and 692D may generate heat evenly.

In addition, the center unit 693 that is connected to the extension unit 692 may have a width greater than that of each of the first through fourth extension units 692A, 692B, 692C, and 692D of the extension unit 692. Therefore, it may be easy to adjust the heat generated from the center unit 693 to be equal to the heat generated from the extension unit 692.

The first through fourth branching lines 691A, 691B, 691C, and 691D, the extension unit 692, and the center unit 693 may include a conductive material, e.g., a material having low resistivity, such as copper, so that a magnitude of a voltage drop may be reduced.

Figure 17:
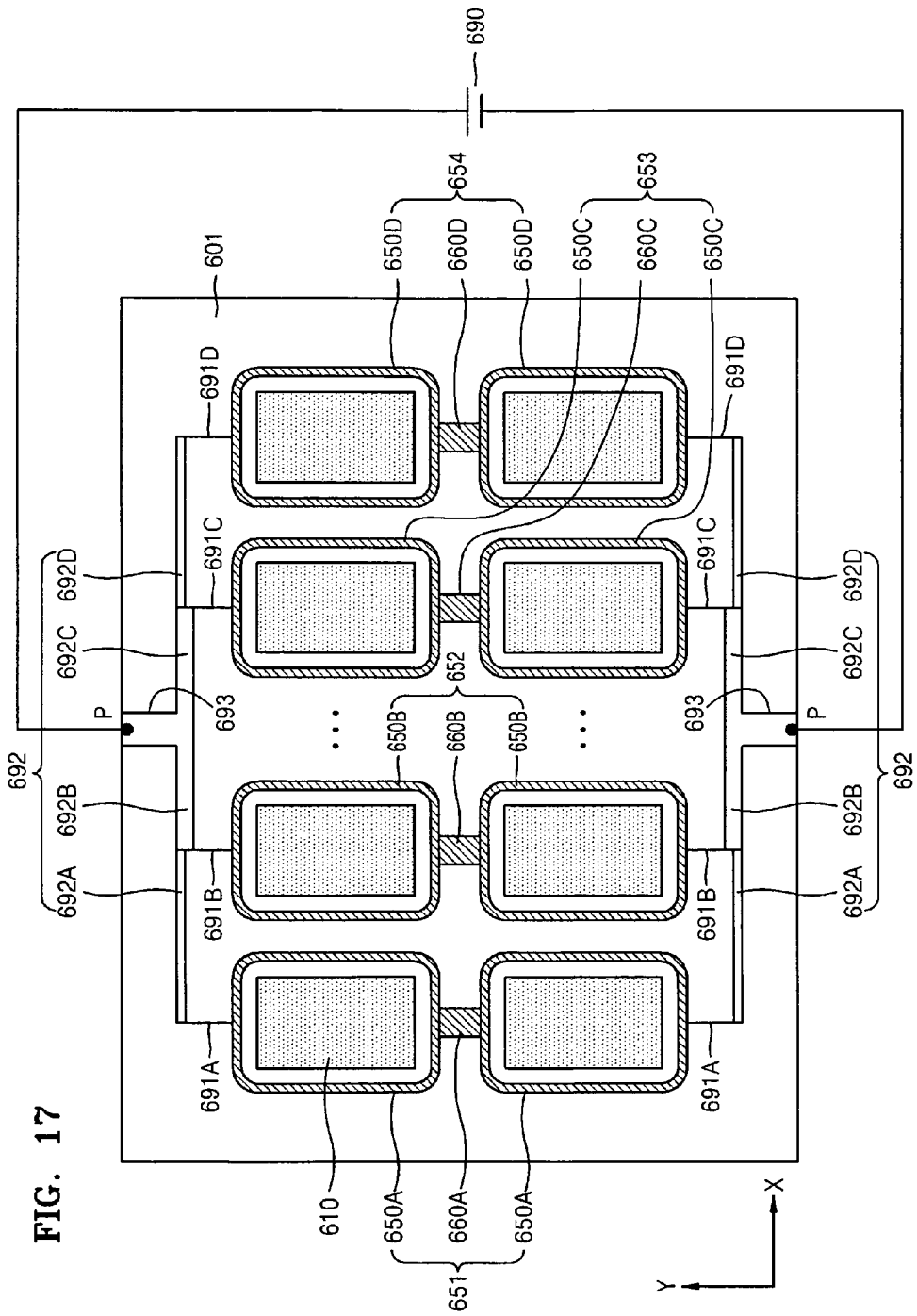
FIG. 17 illustrates a schematic plan view illustrating a process of applying power from a power source to form a sealing member during manufacturing of the mother substrate of FIG. 16.

FIG. 17 illustrates a schematic plan view of a process of applying power from a power source to form the sealing member when the mother substrate 600 of FIG. 16 is fabricated.

Among the processes of forming the mother substrate 600 of FIG. 16, forming the sealing member (not shown) may include providing a material for forming the sealing member (not shown) and then melting and hardening the material for forming the sealing member.

In the melting process, both terminals of a power source 690 may be connected to the conductive points P; and the conductive points P and the first through fourth wiring unit groups 651, 652, 653, and 654 may be connected to each other via the center units 693, the extension units 692, and the first through fourth branching lines 691A, 691B, 691C, and 691D. In addition, the power source 690 may apply voltage to the first through fourth wiring units 650A, 650B, 650C, and 650D in the first through fourth wiring unit groups 651, 652, 653, and 654.

Here, the width of each of the first through fourth extension units 692A, 692B, 692C, and 692D may be reduced the further the first through fourth extension unit 692A, 692B, 692C, and 692D are from the center unit 693. For example, the widths of the second and third extension units 692B and 692C may be greater than the widths of the first and fourth extension units 692A and 692D so as to control heat generated from the first through fourth extension units 692A, 692B, 692C, and 692D to be equal to each other and to prevent the first through fourth extension units 692A, 692B, 692C, and 692D from being damaged by the heat.

In addition, the width of the center unit 693 connected to the extension unit 692 may be greater than that of each of the first through fourth extension units 692A, 692B, 692C, and 692D of the extension unit 692.

Therefore, the current may flow evenly through the first through fourth wiring units 650A, 650B, 650C, and 650D surrounding the display units 610, and accordingly, the sealing member (not shown) may evenly melt and harden. Thus, the sealing property of the mother substrate 600 for forming a flat panel display apparatus may be improved.

According to an embodiment, a mother substrate for forming a flat panel display apparatus and a method of manufacturing the mother substrate, a sealing property of the mother substrate may be improved. In this regard, as previously indicated, the quality of the flat panel display apparatus may be largely affected by a sealing property of the flat panel display apparatus; and the sealing property, in turn, may depend on the sealing substrate and the sealing member. It may be easy, however, to form the sealing member, which limits the ability to improve the sealing property of the flat panel display apparatus. In the embodiments disclosed, however, such limitations are surmounted and, in particular, the embodiments facilitate forming the sealing member, and thus improve the sealing property of the flat panel display apparatus.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A mother substrate for forming flat panel display apparatuses, the mother substrate comprising:
a substrate;
a plurality of display units on the substrate, the display units being for forming a plurality of flat panel display apparatuses;
a sealing substrate facing the display units;
sealing members between the substrate and the sealing substrate, the sealing members surrounding each of the display units;
a plurality of wiring units between the substrate and the sealing substrate, the wiring units overlapping the sealing members;
a connecting unit including a conductive material, the connecting unit connecting adjacent wiring units in one direction and having a width that is greater than a width of each of the wiring units;
inlets connected to the plurality of wiring units and an external power source, the inlets being for applying a voltage to the plurality of wiring units; and
conductive points, wherein:
the plurality of wiring units include a plurality of wiring unit groups,
each of the wiring unit groups includes wiring units arranged along one direction and the connecting unit for connecting the wiring units,
the plurality of wiring unit groups are arranged in another direction that crosses the one direction, and
the conductive points are electrically connected to the external power source and the inlets, the inlets connecting the plurality of wiring unit groups and the conductive points to each other.

2. The mother substrate as claimed in claim 1, wherein:
the wiring units are on the substrate, and
the sealing members are between the wiring units and the sealing substrate.

3. The mother substrate as claimed in claim 1, wherein each of the inlets has a width greater than a width of each of the wiring units.

4. The mother substrate as claimed in claim 1, further comprising a protective layer between the wiring units and the sealing members.

5. The mother substrate as claimed in claim 4, wherein the protective layer extends on upper portions of the inlets.

6. The mother substrate as claimed in claim 1, wherein the sealing members include a frit.

7. The mother substrate as claimed in claim 1, wherein each of the display units includes an organic light-emitting device.

8. The mother substrate as claimed in claim 1, wherein magnitudes of voltage drops in the inlets are about the same in a condition in which voltage is applied from the external power source.

9. The mother substrate as claimed in claim 8, wherein the inlets have the same lengths.

10. The mother substrate as claimed in claim 8, wherein one of the inlets having a first length has an average width smaller than an average width of another one of the inlets having a second length greater than the first length.

11. The mother substrate as claimed in claim 8, wherein one of the inlets having a first length has a thickness smaller than a thickness of another one of the inlets having a second length greater than the first length.

12. The mother substrate as claimed in claim 1, wherein the inlets include:
branching lines at respective ends of each wiring unit group;
extension units connected to ends of the plurality of branching lines; and
a center unit connecting the conductive points and the extension units to each other, and wherein a width of the extension unit at a region closer to the center unit is greater than a width of the extension unit at a region farther from the center unit.

13. The mother substrate as claimed in claim 12, wherein the center unit has a width greater than a width of the extension unit.

14. The mother substrate as claimed in claim 1, wherein the conductive points face opposite sides of the plurality of wiring unit groups.

15. A method of manufacturing the mother substrate for forming flat panel display apparatuses as claimed in claim 1, the method comprising:
   forming the sealing members by melting and hardening a material for forming the sealing members, the melting including using heat generated from the wiring units by applying a voltage from an external power source to the inlets and the wiring units.

16. The method as claimed in claim 15, wherein the sealing members include a frit.

17. The method as claimed in claim 15, wherein magnitudes of voltage drops in the inlets are about the same when applying voltage from the external power source.

18. The method as claimed in claim 17, wherein the inlets have the same lengths.

19. The method as claimed in claim 17, wherein one of the inlets having a first length has an average width smaller than an average width of another one of the inlets having a second length greater than the first length.

20. The method as claimed in claim 17, wherein one of the inlets having a first length has a thickness smaller than a thickness of another one of the inlets having a second length greater than the first length.

21. The method as claimed in claim 15, wherein the inlets include:
   branching lines at respective ends of each wiring unit group;
   extension units connected to ends of the plurality of branching lines; and
   a center unit connecting the conductive points and the extension units to each other, and
   wherein a width of the extension unit at a region closer the center unit is greater than a width of the extension unit a region further from the center unit.

22. The method as claimed in claim 21, wherein the center unit has a width greater than a width of the extension unit.

* * * * *